United States Patent [19]

Kennedy et al.

[11] Patent Number: 4,970,472

[45] Date of Patent: Nov. 13, 1990

[54] COMPENSATED PHASE LOCKED LOOP CIRCUIT

[75] Inventors: Richard A. Kennedy, Russiaville, Ind.; Seyed R. Zarabadi, Columbus, Ohio

[73] Assignee: Delco Electronics Corporation, Kokomo, Ind.

[21] Appl. No.: 402,042

[22] Filed: Sep. 1, 1989

[51] Int. Cl.$^5$ .............................................. H03L 7/089
[52] U.S. Cl. .......................................... 331/8; 331/16; 331/17; 331/25
[58] Field of Search .......................... 331/8, 16, 17, 25

[56] References Cited

U.S. PATENT DOCUMENTS 4,636,748 1/1987 Latham, II ............................ 331/17
4,649,353 3/1987 Sonnenberg .............................. 331/8
4,829,545 5/1989 Guzik et al. ...................... 331/1 A X Primary Examiner—Siegfried H. Grimm
Attorney, Agent, or Firm—Albert F. Duke

[57] ABSTRACT

A Phase Locked Loop (PLL) circuit includes a compensation circuit which corrects for non-linear sensitivity of a varactor of a voltage controlled oscillator (VCO) which is part of the circuit. The varactor is employed as a capacitance tuning element. The compensation circuit controls the sensitivity of a charging-/discharging circuit (a charge pump) of the PLL circuit with a feedback signal which is derived from an input to the VCO. The sensitivity characteristic of the charge pump is made the complement of the non-linear portion of the VCO sensitivity characteristic.

7 Claims, 3 Drawing Sheets

COMPENSATED PHASE LOCKED LOOP CIRCUIT

Field of Invention

This invention relates to tunable Phase Locked Loop (PLL) circuits and in particular to PLL circuits which comprise a Voltage Controlled Oscillator (VCO) in which the tuning element is a voltage controlled diode (i.e., a varactor, as a variable capacitor).

Background of the Invention

Phase Locked Loop (PLL) circuits are widely used as local oscillators in high performance radio receivers. In an FM/AM radio application, PLL circuits are tuned over a wide frequency range e.g., 70 MHz. to 140 MHz.

A common form of voltage controlled oscillator which is used in PLL circuits comprises an inductor, a varactor (a voltage controlled diode whose capacitance changes with applied reverse bias) and an amplifier. Advantageously, inductor/varactor oscillators exhibit low phase/frequency noise. However, varactor voltage sensitivity, i.e., the change in capacitance of a varactor for equal incremental changes in applied voltage, varies in a non-linear fashion as a function of the voltage applied to the varactor at the time the incremental change is made. The voltage sensitivity of a varactor is much higher for the lower values of applied voltage which correspond to the higher values of capacitance and the lower values of VCO operating frequency than for the higher values of applied voltage which correspond to the lower values of capacitance and the higher values of VCO operating frequency. In summary, VCO sensitivity, expressed in terms of MHz/volt, is much higher for low VCO operating frequencies than for high VCO operating frequencies. Typically, the sensitivity of a varactor/inductor VCO might range from 22 MHz/volt at the low frequency end of operation (e.g., 82 MHz) to 1.5 MHz/volt at the high end of operation (e.g., 122 MHz). The non-linearity of the voltage sensitivity of a varactor of a voltage controlled oscillator which is part of a phase locked loop circuit can result in non-predicable loop performance because of variations in loop gain and bandwidth.

It is desirable to have a phase locked loop circuit which uses a varactor and has predicable loop performance.

Summary of the Invention

The present invention is directed to circuitry that performs a phase locked loop function. The circuitry comprises a voltage controlled oscillator (VCO) having an input and an output and being characterized by non-linear sensitivity, comparing means, generating means and compensating means. The comparing means compares the frequency and phase of a reference signal with a signal from the voltage controlled oscillator and is coupled to the voltage controlled oscillator and is adapted to generate output signals having a duration corresponding to the instantaneous phase difference between a reference signal and an output signal of the voltage controlled oscillator. The generating means generates a voltage control signal in accordance with the output signals of the comparing means. It has control inputs coupled to the outputs of the comparing means, has compensation inputs and has an output coupled to the input of the voltage controlled oscillator. The compensating means has outputs coupled to the compensating inputs of the generating means and has an input coupled to the input of the voltage controlled oscillator. It adjusts the sensitivity of the generating means to correct for the non-linear sensitivity of the voltage controlled oscillator.

In a preferred embodiment the voltage controlled oscillator comprises a varactor having a non-linear sensitivity; the comparing means is a digital phase detector; the generating means is the combination of a charge pump (a charge/discharge circuit comprising two serially connected p-channel metal-oxide-semiconductor field effect transistors {MOSFETs} serially connected to two serially connected n-channel MOSFETs), a capacitor (storage element) and a loop filter which comprises an operational amplifier with an AC lead/lag network coupled as a feedback element between a negative input and an output thereof; and the compensating means is a compensating circuit comprising an operational amplifier, resistors and complementary metal-oxide-semiconductor field effect transistors (MOSFETs).

In accordance with this invention, the compensation circuit adjusts the sensitivity of the charge pump as a function of VCO operating frequency to compensate for the non-linear portion of the VCO voltage sensitivity characteristic. The sensitivity of the charge pump as a function of VCO operating frequency is adjusted to be the complement of the non-linear portion of the VCO sensitivity characteristic. That is, the sensitivity of the charge pump is set to be low for low VCO operating frequencies; and to be high for higher VCO operating frequencies. As a result, source or sink pulses (generated by the digital phase detector) of equal duration effect equal instantaneous changes in VCO operating frequency independent of the then current VCO operating frequency.

The compensated phase locked loop circuit of the present invention effectively cancels out the non-linear sensitivity of the varactor of the voltage controlled oscillator and thus provides improved loop performance and stability.

The invention will be better understood from the following more detailed description taken with the accompanying drawings and claims.

Detailed Description

Figure 1:
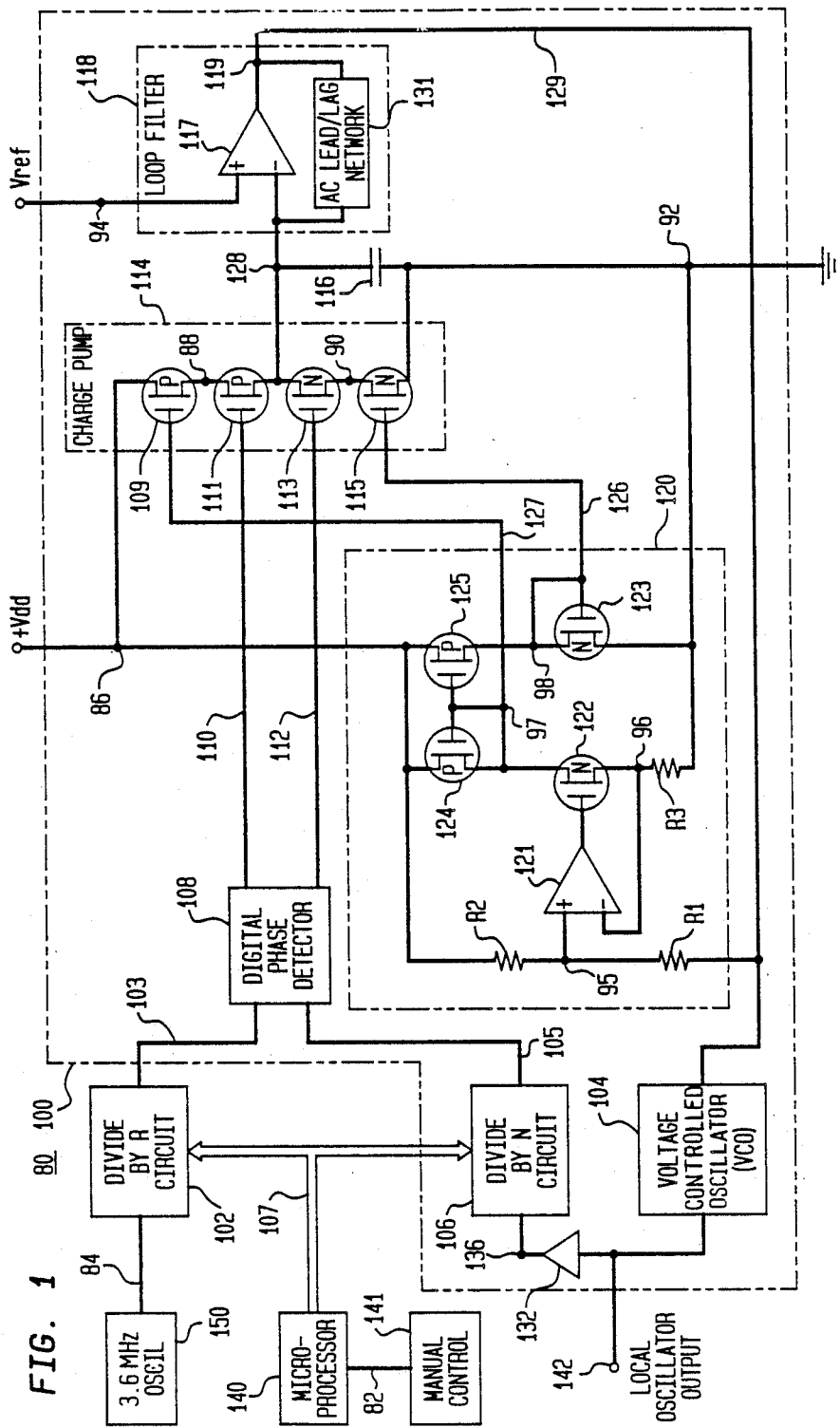
FIG. 1 shows in schematic and block diagram a portion of a radio receiver including a Phase Locked Loop (PLL) circuit in accordance with the present invention.

Referring to FIG. 1, there is shown a portion of a radio receiver 80 which comprises a Phase Locked Loop (PLL) circuit 100 (shown within a dashed line rectangle) in accordance with the present invention. Radio Receiver 80 also comprises a microprocessor 140, a manual control 141 having an output coupled to an input of the microprocessor 141 via a conductor 82, a 3.6 MHz oscillator 150 (shown as 3.6 MHz Oscil) and a divide by R circuit 102. PLL circuit 100 comprises a digital phase detector 108, a charge pump 114, a capacitor 116, a loop filter 118, a compensation circuit 120 (shown within a dashed line rectangle), a divide by N circuit 106, an amplifier 132 and a voltage controlled oscillator (shown as VCO) 104. Charge pump 114 comprises p-channel field effect transistors (FETs) 109 and 111 and n-channel FETs 113 and 115. Loop filter 118 comprises a high gain operational amplifier 117 having positive and negative inputs and an output and an AC lead/lag network 131. AC lead/lag network 131 is a feedback element that is coupled between the negative input and output of amplifier 117. It serves to filter out noise and reference frequency pulse changes and helps to stabilize PLL circuit 100. Compensation circuit 120 comprises an operational amplifier 121 having a positive and a negative input and an output, p-channel FETs 124 and 125, n-channel FETs 122 and 123 and resistors R1, R2 and R3. VCO 104 comprises an inductor, a varactor (a voltage controlled diode whose capacitance changes with applied reverse voltage) and an amplifier (all of which are not shown). In an illustrative embodiment the FETs are metal-oxide-semiconductor field effect transistors (MOSFETs).

Digital phase detector 108 may be denoted as a means for comparing frequency and phase or as comparing means. The combination of charge pump 114, capacitor 116 and loop filter 118 may be denoted as generating means. Compensation circuit 120 may be denoted as non-linear sensitivity adjusting means, as adjusting means or as compensating means. Capacitor 116 may be denoted as a storage element.

Manual control 141, which is a manual interface with a person controlling the radio receiver 80, permits a selection of a particular listening band, e.g., AM or FM, a particular station of the band selected, volume and tone control of the station selection, scan and seek functions, etc. Microprocessor 107 interprets control signals received from manual control 141 and generates address and data signals on an output coupled to a data bus 107 which is coupled to inputs of divide by R and N circuits 102 and 106. Eight bits from microprocessor 140 are coupled to the divide by R circuit and 14 bits are coupled to the divide by N circuit.

An output of the 3.6 MHz OSCIL 150 is coupled via a conductor 84 to an input of divide by R circuit 102. Outputs of divide by R and divide by N circuits 102 and 106 are coupled via conductors 103 and 105 respectively, to inputs of digital phase detector 108. A source signal output of digital phase detector 108 is coupled via a conductor 110 to the gate of FET 111. A sink signal output of digital phase detector 108 is coupled via a conductor 112 to the gate of FET 113. The sources of FETs 109, 124 and 125 and a first terminal of resistor R2 are coupled to a terminal 86 and to a positive voltage source +Vdd. The drain of FET 109 and the source of FET 111 are coupled to a terminal 88. The drains of FETs 111 and 113 are coupled to a first terminal of the capacitor 116, to the negative input of the operational amplifier 117 and to a terminal 128. The source of FET 113 is coupled to the drain of FET 115 and to a terminal 90. The sources of FETs 115 and 123, a first terminal of resistor R3, and a second terminal of capacitor 116 are coupled to a terminal 92 and to a first reference voltage which is shown as ground (zero volts). The positive input of operational amplifier 117 is coupled to a second reference voltage (shown as Vref) and to a terminal 94. In an illustrative embodiment +Vdd and Vref are +10 volts and +5 volts, respectively. The output of operational amplifier 117 is coupled to a terminal 119 which is coupled via a conductor 129 to a first terminal of resistor R1 and to an input of VCO 104. Second terminals of resistors R1 and R2 are coupled to the positive input of operational amplifier 121 and to a terminal 95. The negative input of operational amplifier 121 is coupled to the source of FET 122, to a second terminal of resistor R3 and to a terminal 96. The drain of FET 122 is coupled to the source and gate of FET 124, to a terminal 97 and, via a conductor 127, to the gate of FET 109. The drain of FET 125 is coupled to the gate and drain of FET 123 and to a terminal 98 and, via a conductor 126, to the gate of FET 115.

An output of VCO 104 is coupled to an input of amplifier 132 and to a terminal 142 which is the output terminal of PLL circuit 100 and is shown as LOCAL OSCILLATOR OUTPUT. An output of amplifier 132 is coupled to an input of divide by N circuit 106 and to a terminal 136. Amplifier 132 is a high gain limiting amplifier. In an illustrative embodiment the signal appearing at output terminal 142 is a sine wave having a peak to peak voltage of 100 mv. Amplifier 132 amplifies the input sine wave from VCO 104 and generates therefrom, at the output thereof, a five volt peak to peak square wave having essentially the same frequency as the sine wave.

Divide by R circuit 102, on the basis of data on bus 107, provides a digital internal reference frequency signal on conductor 103. The frequency of the digital reference signal on conductor 103 is a matter of design choice. A single reference frequency (e.g., 50 kHz) may be used for both FM and AM reception or signals of different frequency may be used in AM and FM reception. For example, a reference signal of 25 kHz may be used in AM reception and a 100 kHz reference signal may be used in the case of FM reception. In the case of a 50 kHz internal reference frequency signal, the divide by R circuit is set to divide the 3.6 MHz signal by 72.

Microprocessor 140 tunes PLL circuit 100 to the desired local oscillator frequency by setting the appropriate value for N in a control register (not shown) of divide by N circuit 106. The microprocessor 140 generates on bus 107 address signals to select divide by N circuit 106 and generates data signals to set the value N in the control register (not shown) of divide by N circuit 106. For example, in the case of a 50 kHz internal reference signal and a 100 MHz local oscillator signal, the value N is set to 2,000.

In an FM radio receiver the local oscillator frequency at output terminal 142 is adjusted in 200 kHz steps. In the case of an AM radio receiver, the local oscillator is adjusted in 10 kHz steps.

IN PLL circuit 100, voltage controlled oscillator (VCO) 104 generates "local oscillator" signals on terminal 142. Because of their low phase/frequency noise, inductor/varactor oscillators, such as VCO 104, are well suited for use in a PLL. However, varactor voltage sensitivity, i.e., the change in capacitance of a varactor for equal incremental changes in applied voltage, varies in a non-linear fashion as a function of the voltage applied at the time the incremental change is made. The voltage sensitivity of a varactor is much higher for low values of applied voltage which correspond to high values of capacitance and low values of oscillator frequency than for high values of applied voltage which correspond to low values of capacitance and high values of oscillator operating frequency.

Figure 2:
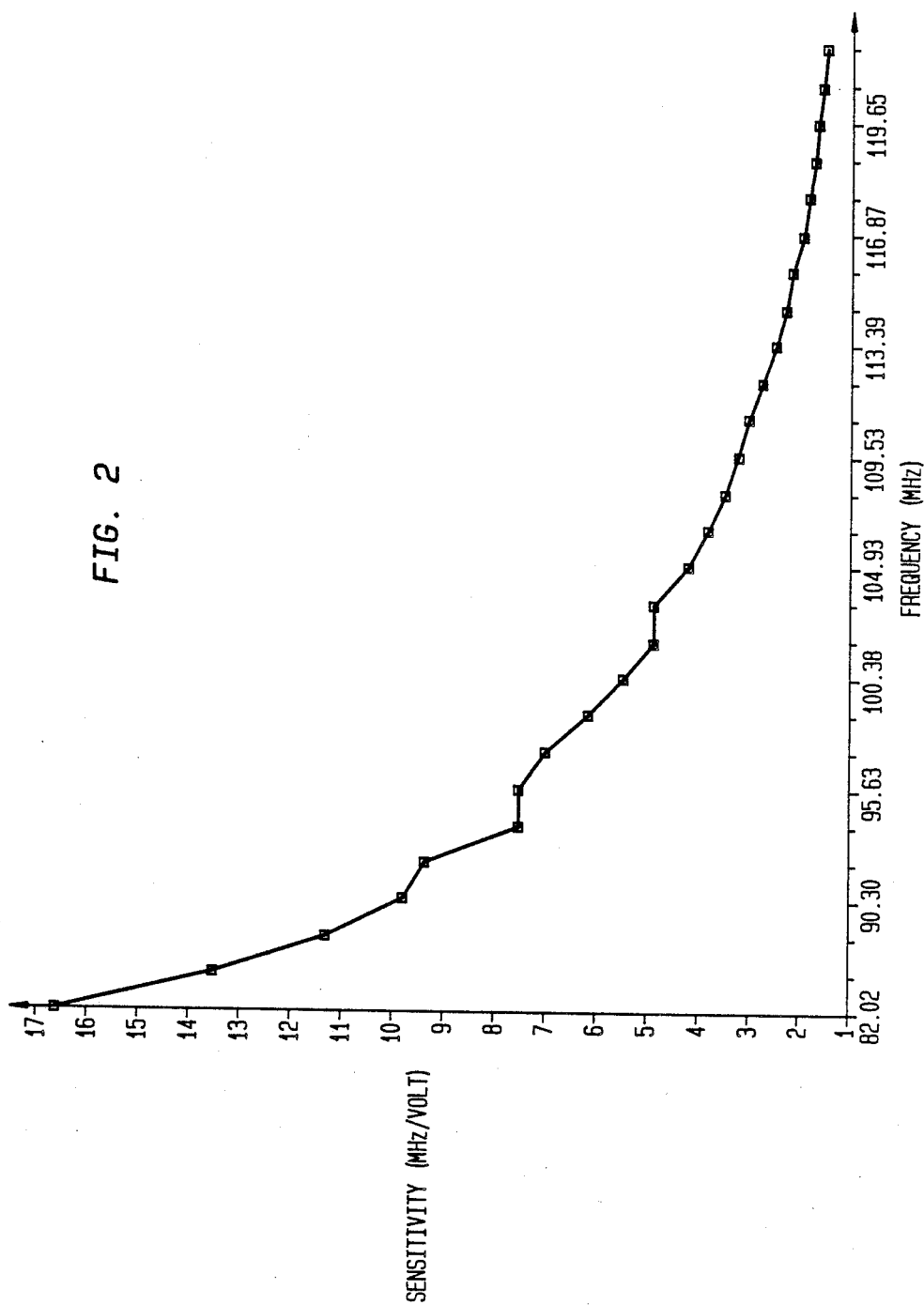
FIG. 2 graphically shows a characteristic of a voltage controlled oscillator which comprises a voltage controlled diode as a tuning element.

FIG. 2 graphically shows the non-linearity of the varactor in an inductor/varactor oscillator results in non-linear voltage sensitivity of the VCO as a function of operating frequency with sensitivity (MHz/volt) on the y-axis and frequency (MHz) on the x-axis. VCO sensitivity ranges from 16.5 MHz/volt at 82 MHz local oscillator frequency to about 1.5 MHz/volt at 122.9 MHz. This wide range of sensitivity affects loop gain of the PLL circuit 100 and thereby degrades performance and threatens stability.

As will be understood from the forthcoming description of the illustrative embodiment, compensation circuit 120 provides DC feedback which is the complement of any non-linearity introduced by the VCO 104. This feedback results in a predictable loop performance (i.e., the loop gain and bandwidth which are the deciding factors of phase noise of VCO 104.

Phase detector circuit 108 is a digital logic circuit which compares the phase of a digital reference signal generated at the output of divide by R circuit 102 onto conductor 103 and a digital output signal generated by the digital divide by N circuit 106 onto conductor 105. It generates mutually exclusive source and sink pulses on conductors 110 and 112 to decrease and increase the VCO operating frequency, respectively. Since each phase comparison involves the divide by R internal reference frequency, source and sink pulses are generated at the reference frequency rate. Of course, when the PLL circuit 100 is locked on frequency, neither source or sink pulses are generated by digital phase detector 108.

Figure 3:
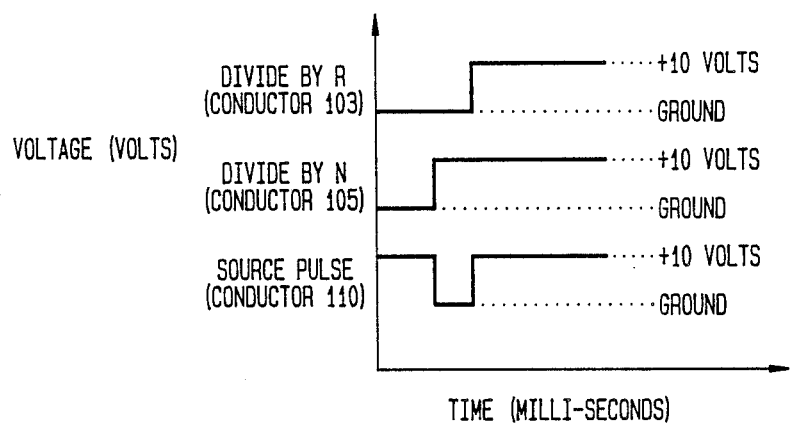
FIGS. 3 and 4 shows voltage waveforms generated by the PLL circuit of FIG. 1.

Referring now to FIG. 3, there is graphically shown voltage waveforms on conductors 103, 105 and 110 versus time with voltage (volts) on the y-axis and time (milliseconds) on the x-axis when the signal on conductor 105 leads the signal on conductor 103. If the reference signal on conductor 103 lags the divide by N signal on conductor 105, the phase detector generates a negative going output pulse on the source output conductor 110 to decrease the VCO 104 output frequency. As seen in FIG. 3, the source conductor 110 is switched from 10 volts to ground for the duration of the source pulse. The duration of the source pulse is directly proportional to the difference in phase between the output divide by R circuit 102 and divide by N circuit 106 output signals.

Figure 4:
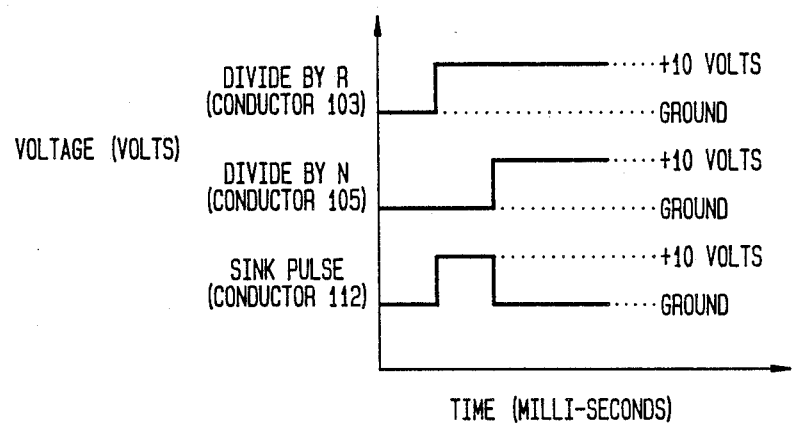

Referring now to FIG. 4, there is graphically shown voltage waveforms on conductors 103, 105 and 112 versus time with voltage (volts) on the y-axis and time (milliseconds) on the x-axis when the signal on conductor 103 leads the signal on conductor 105. If the reference signal on conductor 103 leads the divide by N signal on conductor 105, the phase detector generates a positive going output pulse on the source output conductor 112 to increase the VCO 104 output frequency. The sink conductor 112 is switched from ground to 10 volts for the duration of the sink pulse. Again, the duration of the sink pulse is directly proportional to the difference in phase between the divide by R circuit 102 and the divide by N circuit 106 output signals.

In accordance with this invention, source or sink pulses of equal duration will effect essentially equal instantaneous changes in VCO 104 operating frequency across the full band of VCO 104 operating frequencies.

The PLL circuit 100 adjusts the control signal at the input of the VCO 104 to bring the output terminal 142 of the VCO 104 to the desired local oscillator frequency. This brings the frequency of the output of the divide by N circuit 106 to the frequency of the output of the divide by R circuit 102. As the desired local oscillator frequency is approached, the frequency of output signal of the divide by N circuit 106 approaches the internal reference frequency at the output of divide by R circuit 102. When the output of the divide by R and divide by N circuits are equal in frequency, there are no pulses on the source and sink conductors 110 and 112 and the PLL circuit 100 is "locked". When PLL 100 is locked, the potential on the source conductor 110 is +10 volts and the potential on sink conductor 112 is ground. This biases off (disables) FETs 111 and 113 and thus electrically isolates terminal 128 from +Vdd and ground.

Depending upon the phase difference between the divide by R and the divide by N output signals, charge pump 114 selectively causes terminal 128 to swing between about +Vdd and ground.

Transistors 109 and 115, in accordance with the respective physical sizes and their gate potentials, establish the amount of current sourced from +Vdd through FETs 109 and 111 to terminal 128 and to establish the amount of current sinked (pulled) from terminal 128 through FETs 113 and 115 to ground.

Transistors 111 and 113 are switching transistors which are biased off except for the duration of ground level voltage of source pulses on conductor 110 and the +10 volt level sink pulses on conductor 112. A negative going pulse on source conductor 110 switches transistor 111 fully on and charge is added to capacitor 116 to decrease the output frequency of VCO 104. A positive going pulse on sink conductor 112 switches transistor 113 fully on and charge is removed from capacitor 116 to increase VCO operating frequency.

The charge on capacitor 116 is the input signal for loop filter 118 which includes high gain inverting operational amplifier 117. The details of filter 118 are not included herein as they are not essential to an understanding of the present invention. The output of the loop filter 118 is a voltage signal which varies from about 0 volts to about 10 volts to tune the VCO 104 across the desired band of frequencies (e.g., from 82 to 122 MHz).

In prior art charge pump circuits, fixed control potentials are provided at the gates of transistors 109 and 115 to set the sensitivity of the charge pump. In the prior art arrangement, source and sink pulses of equal duration cause corresponding equal changes in charge of capacitor 116 However, because of non-linear sensitivity of VCO 104, a larger number of source or sink pulses are needed to cause a specific change in VCO 104 operating frequency at the high frequency (low sensitivity) end of VCO 104 operation, compared to the number of source or sink pulses required to effect the same change in frequency at the low frequency (high sensitivity) end of VCO 104 operation. Compensation circuit 120 overcomes this problem by adjusting the sensitivity of the charge pump 114 to be the complement of the non-linear portion of the VCO 104 sensitivity characteristic. Compensation circuit 120 controls the sensitivity of charge pump circuit 114 by adjusting the potentials at the gates of transistors 109 and 115 as a function of VCO control potential.

The potential on the gate of transistor 109 is set by the potential on the gate and drain of transistor 124 of compensation circuit 120; and the potential on the gate of transistor 115 is set by the potential at the gate and drain of transistor 123.

As seen in FIG. 1, the control signal to VCO 104 is also the input signal to the R1, R2 voltage divider of compensation circuit 120. In the illustrative embodiment of FIG. 1, resistor R1 is 40k ohms and resistor R2 is 267k ohms. The VCO 104 control voltage at terminal 119 of loop filter 118 ranges from about 0 volts for low values of VCO 104 operating frequency (e.g., 82 MHz) to about +10 volts for high values of VCO operating frequency (e.g., 122 MHz). The connection point between voltage divider resistors R1 and R2 provides a voltage input signal to the non-inverting input of operational amplifier 121. The input voltage provided by the voltage divider R1, R2 follows the output of loop filter 118; and the current from Vdd (+10 volts) through diode FET 124, FET 122 and resistor R3 tracks the VCO 104 control voltage.

In summary, voltage divider R1, R2, operational amplifier 121, diode connected FET 124, FET 122 and resistor R3 form a voltage to current converter circuit in which the current accurately tracks the input voltage at the positive input of non-inverting operational amplifier 121. The current in FETs 123 and 125 is the mirror of the current in resistor R3.

The gate potential for FET 109 in charge pump 114 is taken from the gate and drain of diode FET 124. For low values of VCO 104 control voltage, which correspond to low values of VCO operating frequency, the potential on the gate of FET 109 is held to a high value to achieve low sensitivity for source pulses. At the same time, the current mirror circuit comprised of FET 125 and diode FET 123 provides a complementary potential to the gate of FET 115 to provide correspondingly low sensitivity for sink pulses. The gate potential for FET 115 is taken from the gate and drain terminals of diode FET 123. For high values of VCO 104 control voltage at which the VCO 104 has low sensitivity, the potentials at the gates of transistors 109 and 115 are adjusted to increase charge pump 114 sink current. Since the compensation circuit 120 adjusts the voltages at the gates of transistors 109 and 115 as a function of VCO 104 control voltage, the sensitivity of charge pump 114 in turn varies as an inverse function of VCO 104 control voltage. The sensitivity of the charge pump 114 is low for low VCO 104 control voltages where the VCO 104 sensitivity is high and high for high VCO 104 control voltages where the VCO 104 sensitivity is low. Thus the sensitivity characteristic of the charge pump 114 as a function of VCO 104 control voltage is the complement of the sensitivity characteristic of the VCO 104 as a function of VCO 104 control voltage.

It is to be understood that the specific embodiments described herein are intended merely to be illustrative of the spirit and scope of the invention. Modifications can readily by made by those skilled in the art consistent with the principles of this invention. For example, other electrical configurations can be substituted for the charge pump 114 and for the compensation circuit 120 so long as they perform the same function. Still further, a low frequency filter can be inserted between the first terminal of resistor R1 and the input of VCO 104 with conductor 129 then terminating at the first terminal of resistor R1.

The embodiments of the invention in which an exclusive property or privilege is claimed are defined as follows:

1. Circuitry comprising:
a voltage controlled oscillator having an input and an output and comprising a varactor which has a non-linear sensitivity;
comparing means comprising a digital phase detector for comparing frequency and phase of a reference signal with a signal from the voltage controlled oscillator, said comparing means being coupled to the voltage controlled oscillator and being adapted to generate output signals having a duration corresponding to the phase difference between a reference signal and an output signal of the voltage controlled oscillator;
generating means for generating a voltage control signal in accordance with the output signals of the comparing means, said generating means having control inputs coupled to the outputs of the comparing means, having compensation inputs and having an output coupled to the input of the voltage controlled oscillator; the generating means further comprising a charge/discharge circuit, a capacitor and a loop filter which comprises an operational amplifier with an AC lead/lag network coupled between a negative input and the output thereof; and
compensation means, which has outputs coupled to the compensation inputs of the generating means and which has an input coupled to the input of the voltage controlled oscillator, for adjusting the sensitivity of the generating means to correct for the non-linear sensitivity of the voltage controlled oscillator, the compensation means comprising an operational amplifier, resistors and complementary field effect transistors.

2. A phase locked loop circuit comprising:
a voltage controlled oscillator having an input and an output and being characterized by non-linear sensitivity;
a digital divider having an input coupled to the output of the voltage controlled oscillator and having an output;
a digital phase detector having a reference signal first input and a second input which is coupled to the output of the digital divider and having outputs; the digital phase detector being adapted to generate signals at the output terminals thereof which define magnitudes and direction of differences in phase between a reference signal applied to the first input thereof and a signal received at the second input thereof from the digital divider;
a capacitor;
a charge pump comprising first and second field effect transistors of a first conductivity type and third and fourth field effect transistors of the opposite conductivity type, each of the transistors having a gate and first and second outputs; the gates of the second and third transistors being connected to respective output terminals of the digital phase detector,
the second output of the first transistor being coupled to the first output of the second transistor;
the second output of the second transistor being coupled to the first output of the third transistor and to a first terminal of the capacitor;
the second output of the third transistor being coupled to the first output of the fourth transistor;
the first output of the first transistor being connected to a source of voltage and the second output of the fourth transistor being connected to a reference voltage;
a low frequency loop filter having an input coupled to the first terminal of the capacitor and having an output for coupling voltage levels stored in the capacitor to the input of the voltage controlled oscillator; and means for adjusting the sensitivity of said charge pump circuit to correct for the non-linear sensitivity of the voltage controlled oscillator, said adjusting means having an input coupled to the output of the loop filter and having first and second outputs coupled to the gates of the first and fourth transistors, respectively.

3. The phase locked loop circuit of claim 2 wherein:
the loop filter comprises a first operational amplifier having a negative input and an output and further comprises an AC lead/lag network; and
the AC lead/lag network being coupled between the negative input and output of the first operational amplifier with the negative input being coupled to the first terminal of the capacitor and with the output being coupled to the input of the voltage controlled oscillator and to an input of the adjusting means.

4. The phase locked loop circuit of claim 3 wherein:
the adjusting means comprises a second operational amplifier, fifth and sixth field effect transistors of the one conductivity type, seventh and eighth field effect transistors of the opposite conductivity type, each of the fifth, sixth, seventh and eighth transistors having a gate and first and second outputs, and first, second and third resistors;
a first terminal of the first resistor being coupled to the output of the first operational amplifier;
a second terminal of the first resistor being coupled to a first terminal of the second resistor and to a positive input of the second operational amplifier;
a first output of the seventh transistor being coupled to a negative input of the second operational amplifier and to a first terminal of the third resistor;
a second output of the seventh transistor being coupled to a first output of the fifth transistor and to the gates of the first, fifth and sixth transistors; and
a first output of the sixth transistor being coupled to the gates of the fourth and eighth transistors and to the first output of the eighth transistor.

5. The phase locked loop circuit of claim 4 wherein the first, second, fifth and sixth transistors are p-channel metal-oxide-semiconductor field effect transistors and the third, fourth, seventh and eighth transistors are n-channel metal-oxide-semiconductor field effect transistors.

6. The phase locked loop circuit of claim 5 wherein the transistors are all formed from silicon.

7. A phase locked loop circuit comprising:
a voltage controlled oscillator having an input and an output and being characterized by non-linear sensitivity;
a digital divider having an input coupled to the output of the voltage controlled oscillator and having an output;
a digital phase detector having first and second inputs which are coupled respectively to a reference signal and to the output of the digital divider and having first and second outputs;
the digital phase detector being adapted to generate signals at the outputs thereof which define magnitudes and direction of differences in phase between the reference signal applied to the first input thereof and a signal received at the second input thereof from the digital divider;
a capacitor;
charge pump means connected across a source of voltage and comprising first and second field effect transistors of opposite conductivity type forming first and second variable current sources, each of said first and second field effect transistors having gate, source and drain electrodes, third and fourth switching field effect transistors of opposite conductivity type for respectively connecting said first and second current sources to said capacitor in response to the first and second outputs of said phase detector for selectively charging and discharging said capacitor;
a low frequency loop filter having an input coupled to said capacitor and having an output for coupling voltage levels stored in said capacitor to the input of the voltage controlled oscillator; and
means for adjusting the current flow in said first and second current sources to correct for the non-linear sensitivity of the voltage controlled oscillator, said adjusting means having an input coupled to the output of the loop filter and having first and second outputs coupled to the gate electrodes of said first and second field effect transistors respectively of said charge pump means whereby the sensitivity of said charge pump means is varied as an inverse function of the voltage applied to the input to the voltage controlled oscillator.

* * * * *